(12) United States Patent
Nabekura

(10) Patent No.: US 8,592,858 B2
(45) Date of Patent: Nov. 26, 2013

(54) LIGHT-EMITTING DIODE AND METHOD FOR FABRICATION THEREOF

(75) Inventor: Wataru Nabekura, Chichibu (JP)

(73) Assignee: Showa Denko K.K., Tokyo (JP)

( * ) Notice: Subject to any disclaimer, the term of this patent is extended or adjusted under 35 U.S.C. 154(b) by 72 days.

(21) Appl. No.: 12/161,452

(22) PCT Filed: Jan. 18, 2007

(86) PCT No.: PCT/JP2007/051111
§ 371 (c)(1),
(2), (4) Date: Oct. 7, 2008

(87) PCT Pub. No.: WO2007/083829
PCT Pub. Date: Jul. 26, 2007

(65) Prior Publication Data
US 2009/0206359 A1    Aug. 20, 2009

Related U.S. Application Data

(60) Provisional application No. 60/763,928, filed on Feb. 1, 2006.

(30) Foreign Application Priority Data

Jan. 23, 2006   (JP) .................................. 2006-013514

(51) Int. Cl.
*H01L 33/00* (2010.01)
(52) U.S. Cl.
USPC ...................... 257/103; 257/95; 257/E33.068
(58) Field of Classification Search
USPC .......................................... 257/103, E33.068
See application file for complete search history.

(56) References Cited

U.S. PATENT DOCUMENTS

| 5,403,916 | A  | * | 4/1995  | Watanabe et al. ............... 438/26 |
| 6,229,160 | B1 |   | 5/2001  | Krames et al. |
| 6,570,190 | B2 | * | 5/2003  | Krames et al. .................. 257/94 |
| 6,586,773 | B2 | * | 7/2003  | Saeki et al. ..................... 257/86 |
| 2002/0081773 | A1 | * | 6/2002 | Inoue et al. .................... 438/108 |
| 2003/0218172 | A1 | * | 11/2003 | Sugawara et al. ............... 257/72 |
| 2009/0278148 | A1 | * | 11/2009 | Nabekura et al. ............... 257/98 |

FOREIGN PATENT DOCUMENTS

| JP | 58-34985 A | 3/1983 |
| JP | 06-296040 A | 10/1994 |

(Continued)

OTHER PUBLICATIONS

Hosokawa, et al., "High-power ohmic-electrodes dispersive AlGaInP double-hetero structure yellowish-green light-emitting diodes"; Journal of Crystal Growth, 2000, pp. 652-656, vol. 221.

*Primary Examiner* — Hsin-Yi Hsieh
(74) *Attorney, Agent, or Firm* — Sughrue Mion, PLLC

(57) ABSTRACT

A light-emitting diode (10) includes a transparent substrate and a compound semiconductor layer that contains a light-emitting part (12) containing a light-emitting layer (133) formed of $(Al_XGa_{1-X})_YIn_{1-Y}P$ ($0 \leq X \leq 1$ and $0 < Y \leq 1$) joined to the transparent substrate (14). The light-emitting diode (10) has on a main light-extracting surface thereof a first electrode (15) and a second electrode (16) different in polarity from the first electrode. The transparent substrate has side faces that are a first side face (142) roughly perpendicular to a light-emitting surface of the light-emitting layer on a side near the light-emitting layer and a second side face (143) inclined relative to the light-emitting surface on a side distant from the light-emitting layer and coarsened with irregularities falling in a range of 0.05 μm to 3 μm.

11 Claims, 5 Drawing Sheets

(56) References Cited

FOREIGN PATENT DOCUMENTS

| | | |
|---|---|---|
| JP | 6-302857 A | 10/1994 |
| JP | 08-102549 A | 4/1996 |
| JP | 2588849 B2 | 12/1996 |
| JP | 2001-57441 A | 2/2001 |
| JP | 3230638 B2 | 9/2001 |
| JP | 2002-246640 A | 8/2002 |
| JP | 2003-249682 A | 9/2003 |
| JP | 2004-521494 A | 7/2004 |
| TW | 480742 B | 3/2002 |
| WO | 02/061847 A2 | 8/2002 |

\* cited by examiner

LIGHT-EMITTING DIODE AND METHOD FOR FABRICATION THEREOF

CROSS REFERENCE TO RELATED APPLICATIONS

This application is an application filed under 35 U.S.C. §111(a) claiming the benefit pursuant to 35 U.S.C. §119(e)(1) of the filing dates of Provisional Applications No. 60/763,928 filed Feb. 1, 2006 and Japanese Patent Application No. 2006-013514 filed Jan. 23, 2006 pursuant to 35 U.S.C. §111(b).

TECHNICAL FIELD

This invention relates to a light-emitting diode having joined to a transparent substrate a semiconductor layer containing a light-emitting layer formed of aluminum-gallium-indium phosphide (($Al_XGa_{1-X}$)$_Y In_{1-Y}$P in which $0 \leq X \leq 1$ and $0 < Y \leq 1$) and a method for the fabrication thereof.

BACKGROUND ART

As a Light-Emitting Diode (LED) capable of emitting a visible light in red color, orange color, yellow color or yellowish-green color, the compound semiconductor LED that is equipped with a light-emitting layer formed of aluminum-gallium-indium phosphide (($Al_XGa_{1-X}$)$_Y In_{1-Y}$P in which $0 \leq X \leq 1$, $0 < Y \leq 1$) has been hitherto known. In the LEDs of this kind, the light-emitting part provided with a light-emitting layer formed of ($Al_XGa_{1-X}$)$_Y In_{1-Y}$P; in which $0 \leq X \leq 1$, $0 < Y \leq 1$, is generally formed on a substrate material, such as gallium arsenide (GaAs) which is optically impervious to the light emitted from the light-emitting layer and mechanically not so strong.

Recently, therefore, with a view to obtaining a visible LED of higher brightness and with the object of further enhancing the mechanical strength of the device, the technique for configuring a junction LED by expelling impervious substrate material, such as GaAs, and thereafter incorporating anew a support layer formed of a transparent material capable of transmitting the emitted light and as well excellent in mechanical strength more than ever has been being developed (refer, for example, to Japanese Patent No. 3230638, JP-A HEI 6-302857, JP-A 2002-246640, Japanese Patent No. 2588849 and JP-A 2001-57441).

For the purpose of fabricating a visible LED of high brightness, the method that relies on the shape of a device to attain improvement in the efficiency of light emission is being used. In the configuration of a device by having electrodes formed respectively on the first surface and on the back surface of a semiconductor light-emitting diode, for example, the technique for accomplishing the enhancement of brightness by the shape of side faces has been disclosed (refer, for example, to JP-A SHO 58-34985 and U.S. Pat. No. 6,229,160).

Though the junction LED has made it possible to provide an LED of high brightness, the need to seek an LED of yet higher brightness is still persisting. Numerous shapes have been proposed for the devices that are so configured as to have electrodes formed on the first surface and the back surface of a light-emitting diode, respectively. The device of a configuration having two electrodes formed on a light-extracting surface is complicated in shape and has not been optimized as respects the state of side faces and the disposition of the electrodes. This invention is directed toward the light-emitting diode provided on the light-extracting surface thereof with two electrodes and is aimed at providing a light-emitting diode of high brightness that exhibits a high efficiency in the extraction of light.

This invention has been produced for the purpose of solving the problem mentioned above.

DISCLOSURE OF THE INVENTION

The present invention provides, as the first aspect thereof, a light-emitting diode comprising a transparent substrate and a compound semiconductor layer that contains a light-emitting part containing a light-emitting layer formed of ($Al_XGa_{1-X}$)$_Y In_{1-Y}$P; in which $0 \leq X \leq 1$ and $0 < Y \leq 1$, and that is joined to the transparent substrate, wherein the light-emitting diode has on a main light-extracting surface thereof a first electrode and a second electrode different in polarity from the first electrode, the transparent substrate has side faces that are a first side face roughly perpendicular to a light-emitting surface of the light-emitting layer on a side near the light-emitting layer and a second side face inclined relative to the light-emitting surface on a side distant from the light-emitting layer and coarsened with irregularities falling in a range of 0.05 μm to 3 μm.

The second aspect of the invention provides the light-emitting diode having the configuration of the first aspect, wherein the transparent substrate is an n-type GaP single crystal.

The third aspect of the invention provides the light-emitting diode having the configuration of the first or second aspect, wherein the transparent substrate has a surface orientation of (100) or (111).

The fourth aspect of the invention provides the light-emitting diode having the configuration of any one of the first to third aspects, wherein the transparent substrate has a thickness in a range of 50 μm to 300 μm.

The fifth aspect of the invention provides the light-emitting diode having the configuration of any one of the first to fourth aspects, wherein the second side face and a surface parallel to the light-emitting surface form therebetween an angle in a range of 55 degrees to 80 degrees.

The sixth aspect of the invention provides the light-emitting diode having the configuration of any one of the first to fifth aspects, wherein the first side face has a width in a range of 30 μm to 100 μm.

The seventh aspect of the invention provides the light-emitting diode having the configuration of any one of the first to sixth aspects, wherein the light-emitting part contains a GaP layer and the second electrode is formed on the GaP layer.

The eighth aspect of the invention provides the light-emitting diode having the configuration of any one of the first to seventh aspects, wherein the first electrode has an n-type polarity and the second electrode has a p-type polarity.

The present invention further provides as the ninth aspect a method for fabricating a light-emitting diode comprising the steps of forming a light-emitting part containing a light-emitting layer formed of ($Al_XGa_{1-X}$)$_Y In_{1-Y}$P; in which $0 \leq X \leq 1$ and $0 < Y \leq 1$, then joining a compound semiconductor layer containing the light-emitting part to a transparent substrate, forming on a main light-extracting surface of the compound semiconductor layer opposite the transparent substrate a first electrode and a second electrode different in polarity from the first electrode, forming as side faces of the transparent substrate a first side face roughly perpendicular to a light-emitting surface of the light-emitting layer on a side near the light-emitting layer and a second side face inclined relative to the light-emitting surface on a side distant from the light-emitting layer, and thereafter coarsening the second side face with irregularities falling in a range of 0.05 μm to 3 μm.

The tenth aspect of the invention provides the method of the ninth aspect, wherein the step of coarsening the second side face is implemented by wet etching.

The eleventh aspect of the invention provides the method of the ninth or ten aspect, wherein the first side face is formed by the scribe and break process.

The twelfth aspect of the invention provides the method of the ninth or tenth aspect, wherein the first side face is formed by the dicing process.

According to this invention, it is made possible to heighten the efficiency of light extraction from the light-emitting part of an LED and consequently accomplish provision of a highly reliable light-emitting diode exhibiting high brightness and low operating voltage.

The above and other objects, characteristic features and advantages of the present invention will become apparent to those skilled in the art from the description to be given herein below with reference to the accompanying drawings.

BEST MODE FOR CARRYING OUT THE INVENTION

Figure 1:
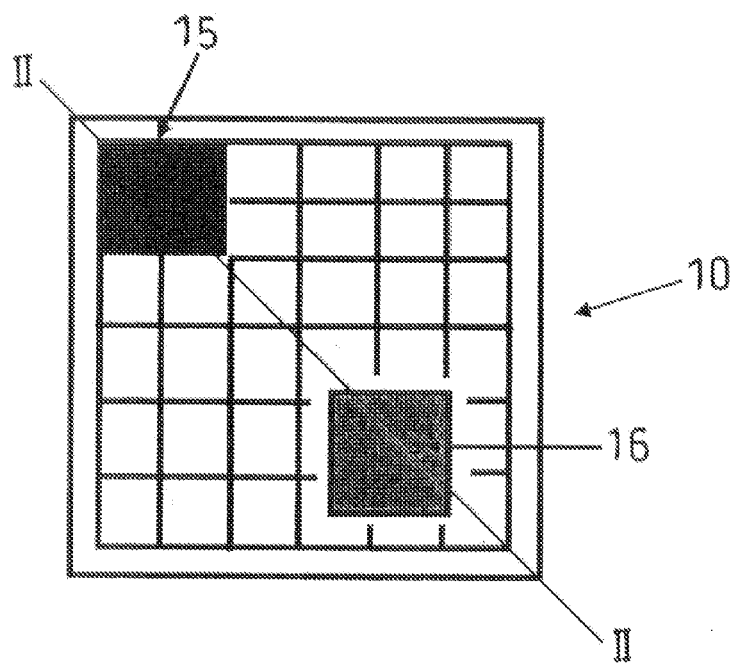
FIG. 1 is a plan view of a semiconductor light-emitting diode fabricated in the example of this invention.

The light-emitting part contemplated by this invention has a compound semiconductor stacked structure containing a light-emitting layer formed of $(Al_XGa_{1-X})_YIn_{1-Y}P$ ($0 \leq X \leq 1$, $0 < Y \leq 1$). The light-emitting layer may be constructed with $(Al_XGa_{1-X})_YIn_{1-Y}P$ ($0 \leq X \leq 1$, $0 < Y \leq 1$) of either of the conduction types, i.e. n-type and p-type. Though the light-emitting layer may be in either of the structures of Single Quantum Well (SQW) and Multi-Quantum Well (MQW), it is proper to select the MQW structure for the sake of obtaining light emission excelling in monochromaticity. The barrier layer that constitutes the Quantum Well (QW) and the composition of $(Al_XGa_{1-X})_YIn_{1-Y}P$ ($0 \leq X \leq 1$, $0 < Y \leq 1$) that forms the well layer are so decided that a quantum level inducing light emission of an expected wavelength may be formed in the well layer.

The light-emitting part, with the object of enabling the carrier and the light emission capable of inducing radiation recombination with the light-emitting layer to be "entrapped" in the light-emitting layer, prefers the so-called Double Hetero (DH) structure including clad layers disposed respectively on the opposite sides of the light-emitting layer as opposed to each other most advantageously for securing the light emission of high intensity. The clad layers are formed preferably of a semiconductor material possessing a wider forbidden band than the composition of $(Al_XGa_{1-X})_YIn_{1-Y}P$ ($0 \leq X \leq 1$, $0 < Y \leq 1$) forming the light-emitting layer and exhibiting a high refractive index. As respects the light-emitting layer formed of a composition of $(Al_{0.4}Ga_{0.6})_{0.5}In_{0.5}P$ emitting a yellowish green color light of a wavelength of about 570 nm, for example, the clad layers are formed of a composition of $(Al_{0.7}Ga_{0.3})_{0.5}In_{0.5}P$ (Y. Hosokawa et al., J Crystal Growth, 221 (2000), 652-656). Between the light-emitting layer and each of the clad layers, an intermediate layer adapted to vary moderately the band discontinuity between the two layers may be interposed. In this case, the intermediate layer prefers to be formed of a semiconductor material possessing a forbidden band width intermediate between the light-emitting layer and the clad layers.

This invention contemplates joining a transparent substrate (transparent support layer) to the semiconductor layer containing the light-emitting layer. The transparent support layer is formed of an optically transparent material possessing sufficient strength for mechanically supporting the light-emitting part and exhibiting a large forbidden band width for enabling transmission of the light emitted from the light-emitting part. This layer may be formed, for example, of a Group III-V compound semiconductor crystal, such as gallium phosphide (GaP), aluminum-gallium arsenide (AlGaAs) or gallium nitride (GaN), a Group II-VI compound semiconductor crystal, such as zinc sulfide (ZnS) or zinc selenide (ZeSe), or a Group IV semiconductor crystal, such as hexagonal or cubic silicon carbide (SiC).

The transparent support layer prefers to have a thickness of about 50 μm or more so as to be capable of supporting the light-emitting part with sufficient mechanical strength. The transparent support layer prefers to have a thickness not exceeding about 300 μm for the purpose of facilitating the mechanical processing that is performed on this layer subsequent to junction. In the compound semiconductor LED that is furnished with the light-emitting layer formed of $(Al_XGa_{1-X})_YIn_{1-Y}P$ ($0 \leq X \leq 1$, $0 < Y \leq 1$), it is most appropriate to have the transparent support layer formed of an n-type GaP single crystal having a thickness of about 50 μm or more and about 300 μm or less.

When the transparent support layer formed of gallium phosphide (GaP) is disposed as joined to the outermost layer of the light-emitting part, for example, the formation of the outermost layer of the light-emitting layer by the use of a Group III-V compound semiconductor material differing in lattice constant from the other Group III-V compound semiconductor component layers of the light-emitting part is enabled to manifest a function of alleviating the stress exerted on the light-emitting part during the junction of the transparent support layer thereto. As a consequence, the light-emitting layer can be prevented from sustaining injury during the course of junction and is enabled, for example, to contribute to stable provision of a compound semiconductor LED that is capable of emitting light of an expected wavelength. It is appropriate to give the outermost layer of the light-emitting part a thickness of 0.5 μm or more for the purpose of sufficiently alleviating the stress exerted on the light-emitting part during the course of the junction of the transparent support layer. If the outermost layer is given an extremely large thickness, the excess of thickness will result in exertion of stress on the light-emitting layer during the course of the formation of the outermost layer on account of the difference in lattice constant from the other component layers of the light-emitting part. For the purpose of avoiding this mishap, it is appropriate to give the outermost layer a thickness of 20 μm or less.

Particularly when gallium phosphide (GaP) is selected for the transparent support layer advantageous for transmitting to the exterior the light emitted from the light-emitting layer formed of $(Al_XGa_{1-X})_YIn_{1-Y}P$ ($0 \leq X \leq 1$, $0 < Y \leq 1$), strong junction can be attained by using a semiconductor material having gallium (Ga) and phosphorus (P) as component elements and containing Ga in a larger amount than P for the formation of the outermost layer of the light-emitting part. It is particularly appropriate to have the outermost layer formed of a nonstoichiometric composition of $(Al_XGa_{1-X})_YIn_{1-Y}$ ($0 \leq X \leq 1$, $0 < Y \leq 1$).

The first surface of the transparent support layer and the first surface of the outermost layer of the light-emitting part that are about to be joined are surfaces formed of single crystals and they prefer to have an identical surface orientation. Both the first surfaces prefer to have a (100) face or a (111) face together. For the purpose of obtaining the outermost layer of the light-emitting part having a (100) face or a (111) face as its surface, it suffices to use a substrate having a (100) face or a (111) face as its surface in the case of forming the outermost layer of the light-emitting part on the substrate. When a gallium arsenide (GaAs) single crystal having a (100) face as its surface is used as the substrate, for example, it is made possible to form the outermost layer of the light-emitting part that has a (100) face as its surface.

The light-emitting part can be formed on the first surface of the substrate of a Group III-V compound semiconductor single crystal, such as gallium arsenide (GaAs), indium phosphide (InP) or gallium phosphide (GaP), or on the first surface of the substrate of silicon (Si). The light-emitting part prefers to have a DH structure capable of "entrapping" the carrier and the light emission that are responsible for radiation recombination as described above. It is appropriate to give the light-emitting part an SQW structure or an MQW structure. As examples of the means to form the component layers of the light-emitting part, the MetalOrganic Chemical Vapor Deposition (MOCVD) means, the Molecular Beam Epitaxial (MBE) means and the Liquid Phase Epitaxial (LPE) means may be cited.

Between the substrate and the light-emitting part, a buffer layer for discharging the function of alleviating the lattice mismatch between the substrate material and the component layers of the light-emitting part, a Bragg reflection layer for reflecting the light emitted from the light-emitting layer to the exterior of the device, an etching stop layer utilized for selective etching and the like are installed. Then, on the component layers of the light-emitting part, a contact layer for lowering the contact resistance of ohmic electrodes, a current diffusion layer for causing the device operating current to be diffused throughout the entire plane of the light-emitting part, and a current inhibition layer and a current constriction layer for conversely limiting the region capable of passing the device operating current may be installed.

Particularly strong junction can be attained when the first surface of the transparent support layer or the outermost layer of the light-emitting part allowing junction thereof is so smooth as to have a root-mean-square (rms) value of 0.3 nm or less. The first surface of this smoothness can be obtained, for example, by the Chemical Mechanical Polishing (CMP) means using an abrasive containing a silicon carbide (SiC)-based fine powder or a cerium (Ce) fine powder. When the polished first surface resulting from the CMP is further treated with an acid solution or an alkali solution, the treatment can further enhance the smoothness of the first surface and contribute to the production of a clean first surface in consequence of removing the foreign matter and the contaminant inflicted during the course of polishing.

The outermost layer of the transparent support layer or the light-emitting part is subjected to junction in a vacuum of $1 \times 10^{-2}$ Pa or less, preferably $1 \times 10^{-3}$ Pa or less, in terms of pressure. Particularly strong junction can be formed by mutually joining two smooth first surfaces that have been obtained by the polishing. Prior to mutually joining the two first surfaces, it is necessary that these first surfaces be activated by being irradiated with an atomic beam or an ion beam possessing an energy of 50 eV or more. The term "activation" as used herein means the impartation to these first surfaces of a clean state that results from depriving these first surfaces of an impurity layer and a contamination layer containing an oxide film and carbon and existing on the first surfaces about to be joined. When the irradiation is implemented on either of the first surfaces of the transparent support layer and the component layers of the light-emitting part, the two first surfaces can be joined strongly and infallibly. They can be joined with still greater strength when they are both subjected to the irradiation.

As an example of the irradiating species that proves to be effective in inducing strong junction; hydrogen (H) atoms, hydrogen molecules ($H_2$), or a hydrogen ion (proton: $H^+$) beam may be cited. When the irradiation is implemented by using a beam containing an element that exists in the surface region about to be joined, the junction to be formed excels in strength. On the occasion of using gallium phosphide (GaP) having added zinc (Zn) for the transparent support layer, for example, strong junction can be formed by irradiating the first surfaces about to be joined with an atom or ion beam containing gallium (Ga), phosphorus (P) or zinc (Zn). If the first surface of the transparent support layer or the outermost layer of the light-emitting part has high electric resistance, however, the irradiation of the first surface with a beam mainly containing ions will possibly result in electrifying the first surface. Since no strong junction can be formed when an electric repulsion ensues from this electrification of the first surface, the activation of the first surface with an ion beam prefers to be utilized for enabling the activation to impart excellent electric conductivity to the first surface.

Then, in the surface region of the transparent support layer or the component layer of the light-emitting part, the use of the beam of an inert gas, such as helium (He), neon (Ne), argon (Ar) or krypton (Kr) which produces no conspicuous change in the relevant composition enables the surface to be stably activated. Particularly, the use of the beam of an argon (Ar) atom (monoatomic molecule) among other inert elements allows the surface to be activated expeditiously and conveniently. Helium (He) has a smaller atomic weight than argon (Ar). The He beam, therefore, is at a disadvantage in entailing waste of time in the activation of first surfaces about to be joined. On the other hand, the use of the beam of krypton (Kr) having a larger atomic weight than argon is at a disadvantage in inflicting an injury of impact on the first surfaces.

On the occasion of causing the first surfaces of the transparent support layer and the outermost layer of the light-emitting part to be overlapped as opposed and then joined, the mechanical pressure enabled to be exerted throughout on the first surfaces being joined proves to be advantageous for strongly joining them. To be specific, pressure in the range between 5 g·cm$^{-2}$ or more and 100 g·cm$^{-2}$ or less is applied in a perpendicular direction to the first surfaces being joined. This procedure achieves an effect of joining the first surfaces with homogenous strength even when either or both of the transparent support layer and the outermost layer of the light-emitting part are warped.

The transparent support layer and the light-emitting part are joined in a vacuum of the aforementioned preferred degree of vacuum while either or both of the support layer and the outermost layer of the light-emitting part have the first surfaces thereof kept at a temperature of 100° C. or less, preferably 50° C. or less and more preferably at room temperature. If the junction is implemented in an environment of high temperature exceeding about 500° C., this excess of temperature will induce thermal denaturation of the light-emitting layer formed of $(Al_XGa_{1-X})_YIn_{1-Y}P$ ($0 \leq X \leq 1$, $0 < Y \leq 1$) and incorporated in the light-emitting part and place at a disadvantage stable production of a compound semiconductor LED capable of emitting light of an expected wavelength.

This invention joins the support layer to the outermost layer of the light-emitting part to thereby enable the support layer to assume a state of mechanically supporting the light-emitting part, then removes the substrate which has been utilized for forming the light-emitting part to thereby enhance the efficiency of extraction of emitted light to the exterior, and consequently enables formation of the compound semiconductor LED having high brightness. Particularly when an optically opaque material inevitably absorbing wholly the light emitted from the light-emitting layer of $(Al_XGa_{1-X})_Y In_{1-Y}P$ ($0 \leq X \leq 1$, $0 < Y \leq 1$) is used for the substrate, the means to remove the substrate in this manner can contribute to stable production of LEDs of high brightness. When a layer formed of a material absorbing the light emitted from the light-emitting layer, such as a buffer layer, for example, intervenes between the substrate and the light-emitting part, the removal of this layer in tandem with the substrate places at an advantage the impartation of high brightness to the LED. The substrate can be removed by the mechanical cutting operation, polishing operation, physical dry or chemical wet etching operation, and the combination of these operations. Particularly by the selective etching means that utilizes differences in etching speed among relevant materials, the substrate alone can be selectively removed and this removal can be accomplished uniformly with good repeatability.

This invention enables a first electrode and a second electrode different in polarity from the first electrode to be formed on the main light-extracting surface 200 of the light-emitting diode. The term "main light-extracting surface" as used in this invention means the surface on the side opposite the surface having pasted the transparent substrate in the light-emitting part. The reason for this invention to form the electrodes as described above consists in effecting impartation of high brightness. The adoption of this structure results in obviating the necessity of feeding an electric current to the transparent substrate. Consequently, the impartation of high brightness is realized owing to successful adhesion of the substrate of high permeability.

This invention contemplates providing the transparent substrate with two side faces, the first one laid roughly perpendicularly to the light-emitting surface of the light-emitting layer at the portion on the side near the light-emitting layer and the second one inclined relative to the light-emitting surface at the portion on the side distant from the light-emitting layer. The reason for this invention to adopt this structure consists in enabling the light released from the light-emitting layer toward the transparent substrate to be efficiently extracted to the exterior. That is, part of the light released from the light-emitting layer toward the transparent substrate is reflected on the first side face and extracted through the second side face. The light reflected on the second side face can be extracted through the first side face. The synergistic effect of the first side face and the second side face enables enhancement of the probability of light extraction.

In this invention, the angle ($\alpha$ in FIG. 2) formed between the second side face and the surface parallel to the light-emitting surface prefers to fall in the range of 55 degrees to 80 degrees. Incidentally, the symbol "$\alpha$" in FIG. 2 denotes not the angle at the corner part but the angle of the edge part of the side face. By setting $\alpha$ in this range, the light reflected on the bottom part of the transparent substrate is efficiently extracted to the exterior.

This invention prefers to give the first side face a width D (in the direction of thickness) that falls in the range of 30 μm to 100 μm. By causing the width of the first side face to fall in this range, the light-emitting diode is enabled to enhance the efficiency of light emission because the light reflected on the bottom part of the transparent substrate is efficiently returned at the portion of the first side face to the light-emitting surface and further released through the main light-extracting surface.

This invention prefers to have the second electrode encircled with a semiconductor layer. The adoption of this structure results in inducing an effect of lowering the operating voltage. By causing the first electrode to envelop the second electrode on the four sides thereof, the electric current is enabled to flow easily in four directions and consequently the operating voltage is allowed to decrease.

This invention prefers to have the first electrode formed in the shape of a lattice. The adoption of this structure induces an effect of enhancing the reliability. The adoption of the shape of a lattice enables uniform entry of an electric current into the light-emitting layer and consequently allows impartation of enhanced reliability.

This invention prefers to have the first electrode composed of a pad electrode and a linear electrode having a width of 10 μm or less. The adoption of this structure induces an effect of enabling impartation of high brightness. By decreasing the width of the electrode, it is made possible to add to the opening area of the light-extracting surface and attain impartation of high brightness.

This invention prefers to give the light-emitting part a structure containing a GaP layer and allow the second electrode to be formed on the GaP layer. The adoption of this structure induces an effect of lowering the operating voltage. By forming the second electrode on the GaP layer, it is made possible to establish a good ohmic contact and consequently lower the operating voltage.

This invention prefers to give the first electrode an n-type polarity and the second electrode a p-type polarity. The adoption of this structure induces an effect of heightening brightness. Forming the first electrode in a p-type polarity results in deteriorating the diffusion of an electric current and induces degradation of brightness. By forming the first electrode in an n-type polarity, it is made possible to enhance the diffusion of an electric current and attain impartation of high brightness.

This invention contemplates coarsening the inclined surface of the transparent substrate and consequently forming irregularities in the range of 0.05 μm to 3 μm, preferably in the range of 0.1 μm to 1 μm on this surface. The adoption of this structure induces an effect of enhancing the efficiency of light extraction through the inclined surface. This is because the coarsening of the inclined surface results in suppressing the total reflection on the inclined surface and enhancing the efficiency of light extraction. Incidentally, the irregularities of the inclined surface in this invention can be determined by the calculation using a photograph produced with a scanning electron microscope. If the irregularities fall short of 0.05 μm, the effect mentioned above will be insufficient If it exceeds 3 µm, the crystal will contain a defect and suffer from inferior reliability.

While the coarsening of the inclined surface contemplated by this invention can be implemented by the dry etching, the wet etching or the like, it prefers to be effected by the wet etching that utilizes the crystal orientation of the side faces of the transparent substrate. When the coarsening is performed by the wet etching, the adoption of the chemical etching with a mixed liquid (consisting of phosphoric acid, hydrogen peroxide and water)+hydrochloric acid proves to be advantageous.

This invention prefers to form the first side face by the scribe and break process or the dicing process. The adoption of the former process enables reduction of the cost of production. To be specific, this process obviates the necessity of allowing a cutting edge during the course of chip separation and consequently allows production of light-emitting diodes in a large number and permits reduction of the cost of production. The latter process induces an effect of heightening brightness. The adoption of this process results in enhancing the efficiency of light extraction through the first side face and enabling impartation of high brightness.

Examples

The present example represents specifically an experiment conducted for fabricating a Light-Emitting Diode (LED) contemplated by this invention with reference to the accompanying drawings.

Figure 2:
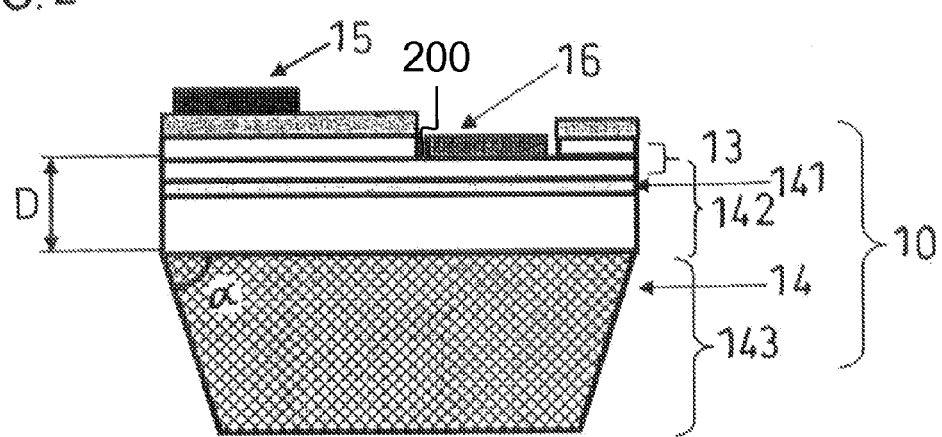
FIG. 2 is a cross section of the semiconductor light-emitting diode of the example of this invention, taken across FIG. 1 along line II-II.
Figure 3:
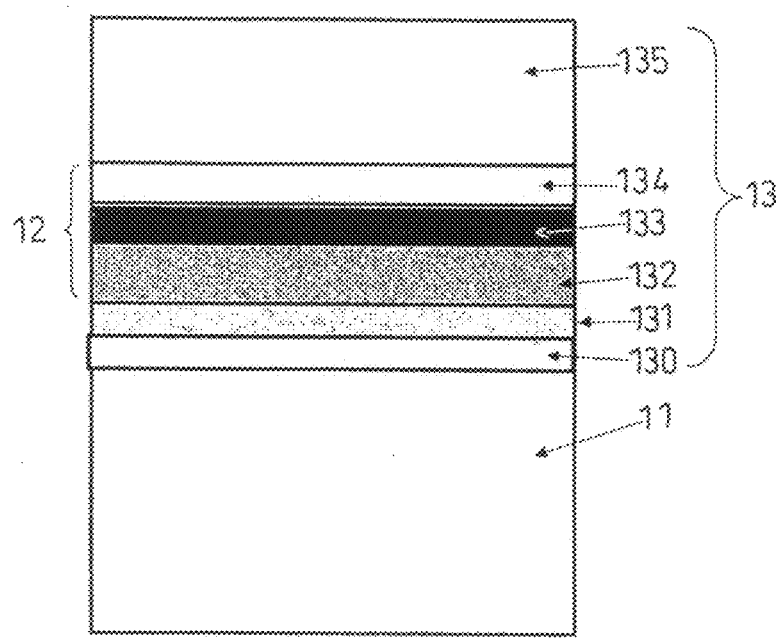
FIG. 3 is a cross section of an epitaxial wafer manufactured in the example of this invention and the comparative example.

FIG. 1 and FIG. 2 illustrate a semiconductor LED fabricated in this example, FIG. 1 being a plan view thereof and FIG. 2 being a cross section thereof taken across FIG. 1 along line II-II. FIG. 3 is a cross section showing the stacked structure of a semiconductor epitaxial wafer used for a semiconductor LED.

A semiconductor light-emitting diode 10 fabricated in this example was a red-color LED furnished with an AlGaInP light-emitting part.

Example 1 specifically explains this invention by reference to the case of fabricating the light-emitting diode by joining an epitaxial stacked structure (epitaxial wafer) installed on a GaAs substrate to a GaP substrate.

The LED 10 was fabricated by using an epitaxial wafer furnished with semiconductor layers 13 sequentially stacked on a semiconductor substrate 11 formed of an Si-doped n-type GaAs single crystal containing a face inclined by 15° from the (100) face. The stacked semiconductor layers were a buffer layer 130 formed of an Si-doped n-type GaAs, a contact layer 131 formed of an Si-doped n-type $(Al_{0.5}Ga_{0.5})_{0.5}In_{0.5}P$, a lower clad layer 132 formed of an Si-doped n-type $(Al_{0.7}Ga_{0.3})_{0.5}In_{0.5}P$, a light-emitting layer 133 formed of 20 pairs of undoped $(Al_{0.2}Ga_{0.8})_{0.5}In_{0.5}P/-(Al_{0.7}Ga_{0.3})_{0.5}In_{0.5}P$, an intermediate layer 134 consisting of an upper clad layer formed of an Mg-doped p-type $(Al_{0.7}Ga_{0.3})_{0.5}In_{0.5}P$ and a thin film of $(Al_{0.5}Ga_{0.5})_{0.5}In_{0.5}P$, and an Mg-doped p-type GaP layer 135.

In this example, the component semiconductor layers 130 to 135 were stacked on the GaAs substrate 11 by the low-pressure MOCVD method using trimethyl aluminum $((CH_3)_3Al)$, trimethyl gallium $((CH_3)_3Ga)$ and trimethyl indium $((CH_3)_3In)$ as raw materials for Group III component elements, with the result that an epitaxial wafer was formed. As the raw material for Mg doping, biscyclopentadiethyl magnesium (bis-$(C_5H_5)_2$Mg) was used. Disilane $(Si_2H_6)$ was used as the raw material for Si doping. As the raw material for a Group V component element, phosphine $(PH_3)$ or arsine $(AsH_3)$ was used. The GaP layer 135 was grown at 750° C. and the other component semiconductor layers 130 to 134 composing the semiconductor layer 13 were grown at 730° C.

The GaAs buffer layer 130 had a carrier concentration of about $2 \times 10^{18}$ cm$^{-3}$ and a layer thickness of about 0.2 µm. The contact layer 131 was formed of $(Al_{0.5}Ga_{0.5})_{0.5}In_{0.5}P$ and had a carrier concentration of about $2 \times 10^{18}$ cm$^{-3}$ and a layer thickness of about 1.5 µm. The n-clad layer 132 had a carrier concentration of about $8 \times 10^{17}$ cm$^{-3}$ and a layer thickness of about 1 µm. The light-emitting layer 133 was an undoped film measuring 0.8 µm in thickness. The p-clad layer 134 had a carrier concentration of about $2 \times 10^{17}$ cm$^{-3}$ and a layer thickness of 1 µm. The GaP layer 135 had a carrier concentration of about $3 \times 10^{18}$ cm$^{-3}$ and a layer thickness of 9 µm.

The p-type GaP layer 135 had a region reaching a depth of about 1 µm from the surface polished till mirror finish. By the mirror polishing, the surface of the p-type GaP layer 135 was coarsened till 0.18 nm. Meantime, an n-type GaP substrate 14 adapted to be pasted to the mirror-polished surface of the p-type GaP layer 135 was prepared. This GaP substrate 14 for pasting was made to add Si and Te till a carrier concentration of about $2 \times 10^{17}$ cm$^{-3}$. A single crystal having a surface orientation of (111) was used. The GaP substrate 14 for pasting had a diameter of 50 mm and a thickness of 250 µm. This GaP substrate 14 had the surface thereof polished specularly prior to being joined to the p-type GaP layer 135 so as to be finished to a root-mean-square (rms) value of 0.12 nm.

The GaP substrate 14 and the epitaxial wafer were brought into an ordinary semiconductor material pasting device and the interior of the device was evacuated till a vacuum of $3 \times 10^{-5}$ Pa. Thereafter, the GaP substrate 14 mounted inside the device that had expelled members made of carbon materials with the object of avoiding contamination as with carbon was heated in a vacuum to a temperature of about 800° C. and meantime irradiated with Ar ions accelerated to an energy of 800 eV. Consequently, a joining layer 141 formed of a nonstoichiometric composition was formed on the first surface of the GaP substrate 14. Subsequent to the formation of the joining layer 141, the radiation of Ar ions was stopped and the temperature of the GaP layer 14 was lowered to room temperature.

Figure 4:
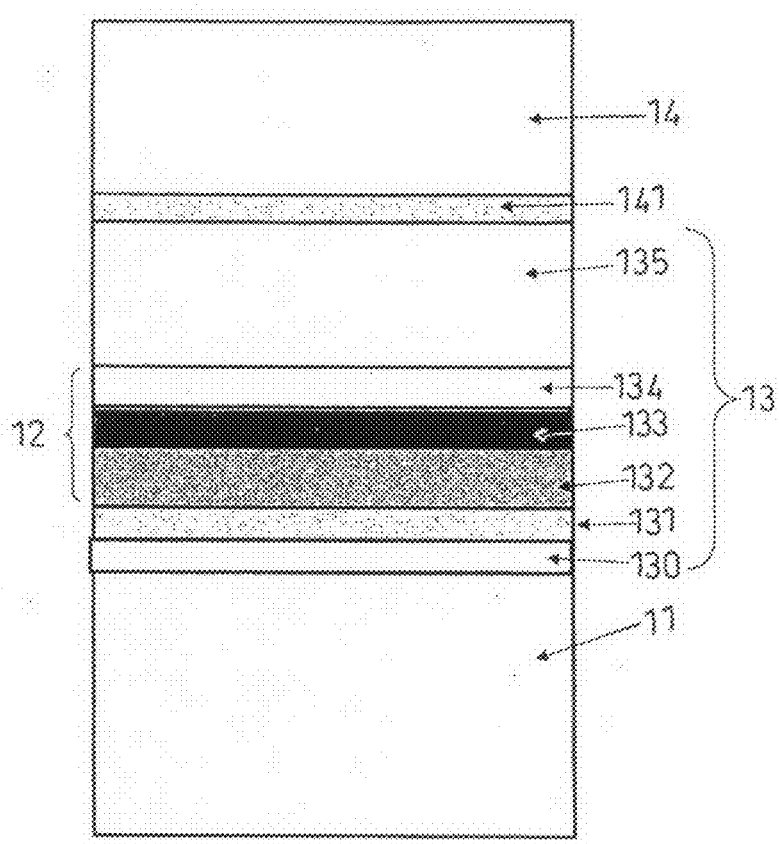
FIG. 4 is a cross section of a wafer having joined thereto a transparent substrate manufactured in the example of this invention and the comparative example.

The first surfaces of both the GaP substrate 14 furnished in the surface region thereof with the joining layer 141 formed of the nonstoichiometric composition and the GaP layer 135 were irradiated with an Ar beam neutralized by collision of electrons over a period of 3 minutes. The first surfaces of both the layers 135 and 14 were overlapped inside the pasting device retaining a vacuum and joined at room temperature under a load adjusted to exert a pressure of 20 g/cm$^2$ on both the first surfaces (FIG. 4). The wafer resulting from the junction was extracted from the vacuum chamber of the pasting device and assayed for the interface of junction. As a result, the joined part was found to contain therein the joining layer 141 formed of $Ga_{0.6}P_{0.4}$ possessing a nonstoichiometric composition. The joining layer 141 had a thickness of about 3 nm and an oxygen atom concentration of $7 \times 10^{18}$ cm$^{-3}$, a magnitude determined by an ordinary SIMS analysis method, and a carbon atom concentration of $9 \times 10^{18}$ cm$^{-3}$.

Then, from the joined wafer, the GaAs substrate 11 and the GaAs buffer layer 130 were selectively removed with an ammonia-based etchant.

On the first surface of the contact layer 131, an AuGeNi alloy was deposited in a thickness of 0.5 µm, Pt in a thickness of 0.2 µm, and Au in a thickness of 1 µm by the vacuum evaporation method to form an n-type ohmic electrode as a first ohmic electrode 15. This electrode was patterned by the ordinary means of photolithography to complete the electrode 15.

Next, the GaP layer 135 was exposed by selectively removing the epitaxial layers 131 to 134 in the region forming the p-electrode. On the first surface of the GaP layer, AuBe was deposited in a thickness of 0.2 μm and Au in a thickness of 1 μm by the vacuum evaporation method to give rise to a p-type ohmic electrode 16.

The electrodes were heat-treated at 450° C. for 10 minutes to complete alloyed low-resistance p-type and n-type ohmic electrodes (FIG. 1 and FIG. 2).

Next, a V-shaped groove adjusted to have the width D of a first side face of 80 μm was inserted into the GaP substrate 14 from the back surface by using a dicing saw so that the angle α of the inclined surface shown in FIG. 2 (not the part of a corner but the part of an edge here) might become 70°.

Figure 9:
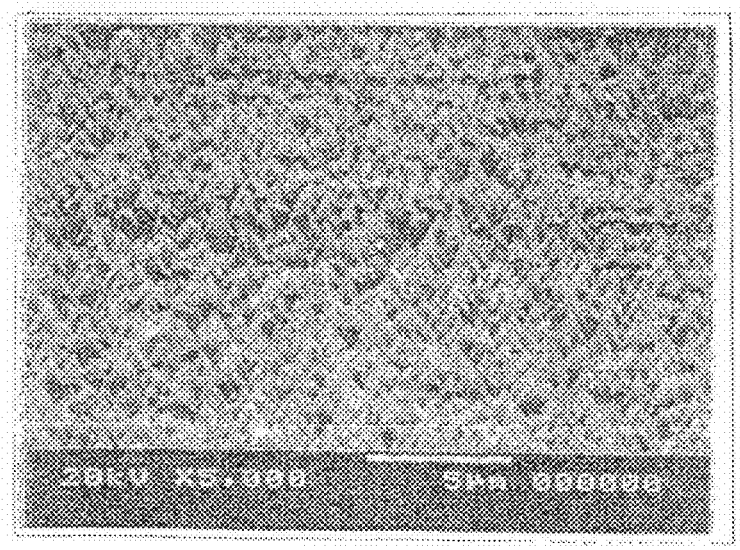
FIG. 9 is an electron micrograph of the coarsened second side face in the example of this invention.

The first surface of the light-emitting diode was protected with a resist and the inclines faces thereof were coarsened by etching with an etchant consisting of phosphoric acid, hydrogen peroxide and water and with hydrochloric acid. The irregularities of the coarsened faces were about 500 nm (0.5 μm). The electron micrograph of the coarsened face is shown in FIG. 9.

Next the wafer was cut from the first surface side with a dicing saw at intervals of 350 μm to produce chips. The semiconductor LED (chip) 10 was completed by removing the broken layer and the contaminants resulting from the dicing by using a mixed liquid of sulfuric acid and hydrogen peroxide.

Figure 5:
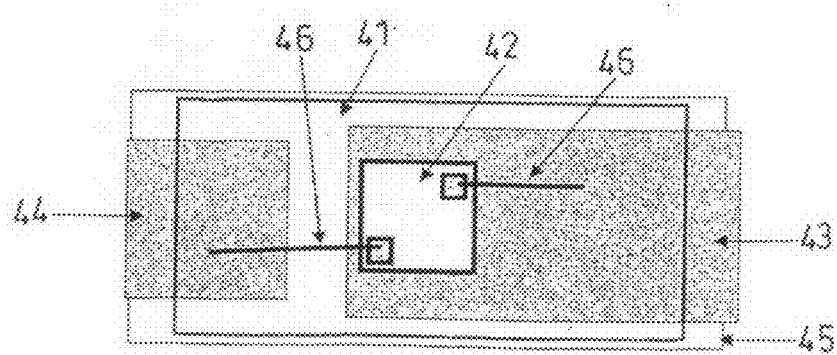
FIG. 5 is a plan view of the light-emitting diode fabricated in the example of this invention and the comparative example.
Figure 6:
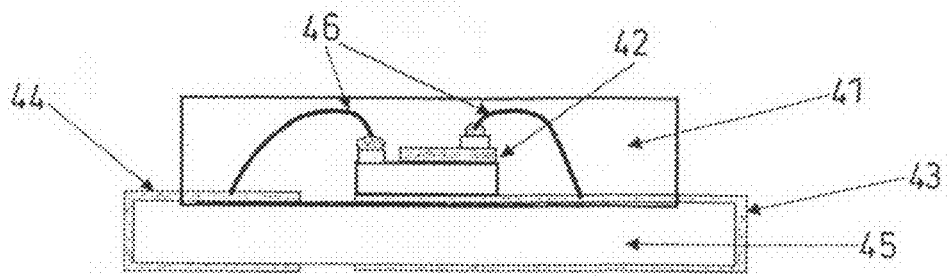
FIG. 6 is a cross section of the light-emitting diode fabricated in the example of this invention and the comparative example.

An LED lamp 42 illustrated schematically in FIG. 5 and FIG. 6 was configured by using the LED chip 10 fabricated as described above. This LED lamp 42 was fabricated by mounting the LED chip fast on a mounting substrate 45 with silver paste, wire-bonding the n-type ohmic electrode 15 of the LED chip 10 to an n-electrode terminal 43 installed on the first surface of the mounting substrate 45 and the p-type ohmic electrode 16 to a p-electrode terminal 44 with gold wires 46, and thereafter sealing the joined corners with an ordinary epoxy resin 41.

When an electric current was passed between the n-type and p-type ohmic electrodes 15 and 16 via the n-electrode terminal 43 and the p-electrode terminal 44 disposed on the first surface of the mounting substrate 45, a red-color light having a main wavelength of 620 nm was emitted. The forward voltage (Vf) during the passage of an electric current of 20 mA in the forward direction reached about 1.95 V, a magnitude reflecting the proper layout of the electrodes and the good ohmic properties of the ohmic electrodes 15 and 16. The intensity of the light emitted when the forward current was set at 20 mA reached a high degree of brightness of 1000 mcd, a magnitude reflecting the structure of the light-emitting part of a high efficiency of light emission and the fact that the efficiency of extraction to the exterior was enhanced as by removing the broken layer during the separation of the wafer into chips.

Comparative Example

Figure 7:
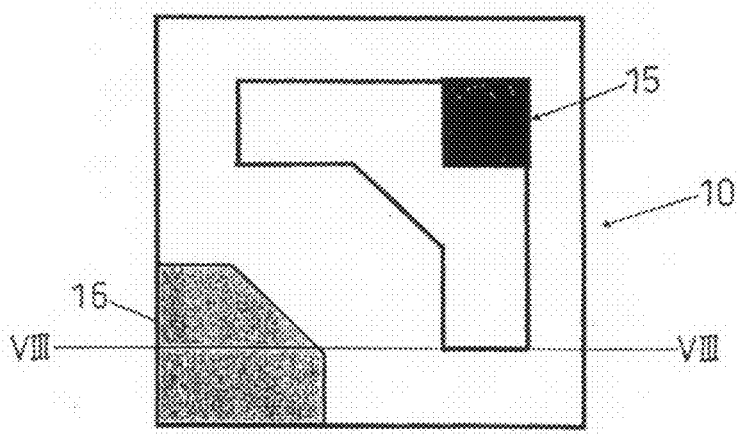
FIG. 7 is a plan view of the semiconductor light-emitting diode fabricated in the comparative example.
Figure 8:
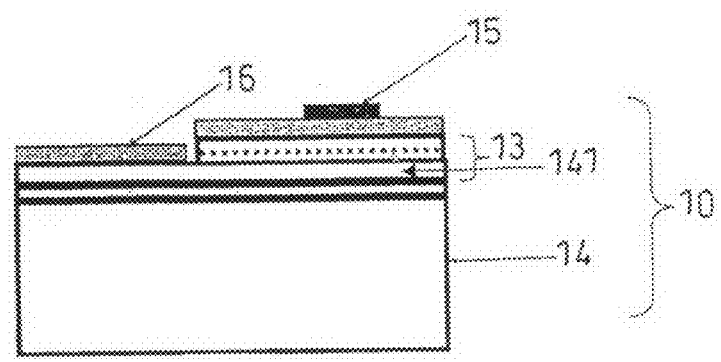
FIG. 8 is a cross section of the semiconductor light-emitting diode fabricated in the comparative example, taken across FIG. 7 along line VIII-VIII.

In the same manner as in the foregoing example, p-type and n-type ohmic electrodes were formed as illustrated in FIG. 7 and FIG. 8.

Next, the wafer was cut from the first surface side with a dicing saw at intervals of 350 μm to produce chips. The semiconductor LED (chip) 10 was obtained by removing the broken layer and the contaminants produced in consequence of the dicing with a mixed liquid of sulfuric acid and hydrogen peroxide.

The LED lamp 42 illustrated schematically in FIG. 5 and FIG. 6 was configured by using the LED chip 10 fabricated as described above. This LED lamp 42 was fabricated by mounting the LED chip fast on a mounting substrate 45 with silver paste, wire-bonding the n-type ohmic electrode 15 of the LED chip 10 to an n-electrode terminal 43 installed on the first surface of the mounting substrate 45 and the p-type ohmic electrode 16 to a p-electrode terminal 44 with gold wires 46, and thereafter sealing the joined corners with an ordinary epoxy resin 41.

When an electric current was passed between the n-type and p-type ohmic electrodes 15 and 16 via the n-electrode terminal 43 and the p-electrode terminal 44 disposed on the first surface of the mounting substrate 45, a red-color light having a main wavelength of 620 nm was emitted. The forward voltage (Vf) during the passage of an electric current of 20 mA in the forward direction was about 2.30 V. The intensity of the light emitted when the forward current was set at 20 mA was 200 mcd.

INDUSTRIAL APPLICABILITY

The light-emitting diode of this invention can be advantageously utilized for various kinds of display lamps as a highly reliable light-emitting diode that emits a visible light in a red, orange, yellow or yellowish green color, excels in the efficiency of light extraction from the light-emitting part, exhibits high brightness and allows operation with a low voltage.

The invention claimed is:

1. A light-emitting diode comprising:
   a transparent substrate having a first side and a second side which is opposite the first side and has an area smaller than that of the first side; and
   a compound semiconductor layer that contains a light-emitting part containing a light-emitting layer formed of $(Al_XGa_{1-X})_YIn_{1-Y}P$; in which $0 \leq X \leq 1$ and $0 < Y \leq 1$, and is joined to the transparent substrate;
   wherein the light-emitting diode has a main light-extracting surface and has a first electrode and a second electrode different in polarity from the first electrode,
   the first and second electrodes being disposed on a same larger first side of the transparent substrate,
   the main light-extracting surface is on a side of the compound semiconductor layer opposite the side of the compound semiconductor layer joined to the transparent substrate,
   the transparent substrate has side faces that are a first side face roughly perpendicular to a light-emitting surface of the light-emitting layer on a side near the light-emitting layer and a second side face inclined relative to the light-emitting surface on a side distant from the light-emitting layer,
   the second side face of the transparent substrate is coarsened with irregularities falling in a range of 0.05 μm to 3 μm, and
   the light-emitting part contains a GaP layer and the second electrode is formed in direct contact with the GaP layer.

2. A light-emitting diode according to claim 1, wherein the transparent substrate is an n-type GaP single crystal.

3. A light-emitting diode according to claim 1, wherein the transparent substrate has a surface orientation of (100) or (111).

4. A light-emitting diode according to claim 1, wherein the transparent substrate has a thickness in a range of 50 μm to 300 μm.

5. A light-emitting diode according to claim 1, wherein the second side face and a surface parallel to the light-emitting surface form therebetween an angle in a range of 55 degrees to 80 degrees.

6. A light-emitting diode according to claim 1, wherein the first side face has a width in a range of 30 μm to 100 μm.

7. A light-emitting diode according to claim 1, wherein the polarity of the first electrode is n-type and the polarity of the second electrode is p-type.

8. A method for fabricating a light-emitting diode, said light-emitting diode comprising;
   a transparent substrate having a first side and a second side which is opposite the first side and has an area smaller than that of the first side; and
   a compound semiconductor layer that contains a light-emitting part containing a light-emitting layer formed of $(Al_XGa_{1-X})_YIn_{1-Y}P$; in which $0 \leq X \leq 1$ and $0 < Y \leq 1$, and that is joined to the transparent substrate;
   wherein the light-emitting diode has a main light-extracting surface and has a first electrode and a second electrode different in polarity from the first electrode, the first and second electrodes being disposed on a same larger first side of the transparent substrate, the main light-extracting surface is on a side of the compound semiconductor layer opposite the side of the compound semiconductor layer joined to the transparent substrate, the transparent substrate has side faces that are a first side face roughly perpendicular to a light-emitting surface of the light-emitting layer on a side near the light-emitting layer and a second side face inclined relative to the light-emitting surface on a side distant from the light-emitting layer, the second side face of the transparent substrate is coarsened with irregularities falling in a range of 0.05 μm to 3 μm, and the light-emitting part contains a GaP layer and the second electrode is formed in direct contact with the GaP layer;
said method comprising the steps of:
forming the light-emitting part containing the light-emitting layer formed of $(Al_XGa_{1-X})_YIn_{1-Y}P$; in which $0 \leq X \leq 1$ and $0 < Y \leq 1$;
then joining the compound semiconductor layer containing the light-emitting part to the transparent substrate;
forming on the main light-extracting surface of the compound semiconductor layer opposite the transparent substrate the first electrode and the second electrode different in polarity from the first electrode;
forming as the side faces of the transparent substrate the first side face roughly perpendicular to the light-emitting surface of the light-emitting layer on the side near the light-emitting layer and the second side face inclined relative to the light-emitting surface on the side distant from the light-emitting layer by the dicing process; and
thereafter coarsening the second side face with irregularities falling in the range of 0.05 μm to 3 μm.

9. A method according to claim 8, wherein the step of coarsening the second side face is implemented by wet etching.

10. A method according to claim 8, wherein the first side face is formed by the scribe and break process.

11. A method according to claim 8, wherein the first side face is formed by the dicing process.

* * * * *